(12) United States Patent
Herberholz et al.

(10) Patent No.: US 9,012,998 B2
(45) Date of Patent: Apr. 21, 2015

(54) GATE DEPLETION DRAIN EXTENDED MOS TRANSISTOR

(71) Applicant: Cambridge Silicon Radio Limited, Cambridge (GB)

(72) Inventors: Rainer Herberholz, Cambridge (GB); Ludovic Oddoart, Le Rouret (FR); David Vigar, Cambridge (GB)

(73) Assignee: Cambridge Silicon Radio Ltd, Cambridge (GB)

( * ) Notice: Subject to any disclaimer, the term of this patent is extended or adjusted under 35 U.S.C. 154(b) by 0 days.

(21) Appl. No.: 14/333,334

(22) Filed: Jul. 16, 2014

(65) Prior Publication Data

US 2015/0044838 A1 Feb. 12, 2015

Related U.S. Application Data

(62) Division of application No. 13/086,560, filed on Apr. 14, 2011, now Pat. No. 8,816,441.

(30) Foreign Application Priority Data

Apr. 30, 2010 (GB) .................................. 1007220.5

(51) Int. Cl.
| | |
|---|---|
| *H01L 21/8234* | (2006.01) |
| *H01L 29/10* | (2006.01) |
| *H01L 29/49* | (2006.01) |
| *H01L 29/66* | (2006.01) |
| *H01L 29/78* | (2006.01) |
| *H01L 21/266* | (2006.01) |
| *H01L 21/28* | (2006.01) |
| *H01L 21/265* | (2006.01) |
| *H01L 29/06* | (2006.01) |

(52) U.S. Cl.
CPC ... *H01L 21/823418* (2013.01); *H01L 21/26586* (2013.01); *H01L 29/0653* (2013.01); *H01L 29/1045* (2013.01); *H01L 29/4916* (2013.01); *H01L 29/66537* (2013.01); *H01L 29/66659* (2013.01); *H01L 29/7835* (2013.01); *H01L 21/266* (2013.01); *H01L 21/28035* (2013.01); *H01L 21/823437* (2013.01); *H01L 29/66583* (2013.01)

(58) Field of Classification Search
USPC .............................. 257/368, E27.06, E21.409
See application file for complete search history.

(56) References Cited

U.S. PATENT DOCUMENTS

| | | | |
|---|---|---|---|
| 2002/0155686 A1* | 10/2002 | Lin et al. ...................... 438/527 |
| 2003/0109112 A1 | 6/2003 | Wu | |
| 2003/0176041 A1 | 9/2003 | Lee et al. | |
| 2006/0046362 A1* | 3/2006 | Lin et al. ...................... 438/163 |
| 2008/0073745 A1 | 3/2008 | Tang et al. | |
| 2008/0272408 A1 | 11/2008 | Vora | |

(Continued)

OTHER PUBLICATIONS

Combined Search and Examination Report for GB1413894.5 mailed Aug. 29, 2014 (4 pages).

(Continued)

*Primary Examiner* — Marc Armand
(74) *Attorney, Agent, or Firm* — John W. Branch; Lowe Graham Jones PLLC

(57) ABSTRACT

A drain extended MOS transistor configured to operate in a gate-depletion regime. Devices comprising such transistors are described together with fabrication processes for such devices and transistors.

3 Claims, 11 Drawing Sheets

(56) References Cited

U.S. PATENT DOCUMENTS

2009/0256212 A1 10/2009 Denison et al.
2010/0032755 A1 2/2010 Benaissa et al.

OTHER PUBLICATIONS

Official Communication for U.S. Appl. No. 13/086,560 mailed Jun. 21, 2012 (5 pages).

Official Communication for U.S. Appl. No. 13/086,560 mailed Oct. 22, 2012 (10 pages).

Official Communication for U.S. Appl. No. 13/086,560 mailed Mar. 19, 2013 (11 pages).

Official Communication for U.S. Appl. No. 13/086,560 mailed May 20, 2013 (3 pages).

Official Communication for U.S. Appl. No. 13/086,560 mailed Jan. 14, 2014 (12 pages).

Official Communication for U.S. Appl. No. 13/086,560 mailed Apr. 25, 2014 (8 pages).

* cited by examiner

GATE DEPLETION DRAIN EXTENDED MOS TRANSISTOR

CROSS-REFERENCE TO RELATED APPLICATIONS

This utility patent application is a Divisional of U.S. patent application Ser. No. 13/086,560, filed Apr. 14, 2011. The benefit of this utility application is hereby claimed under 35 U.S.C. §120 and is incorporated herein by reference in its entirety.

BACKGROUND

This invention relates to Drain Extended MOS transistors.

Scaling of CMOS technology leads to not only on increase in device density but also reduction in gate-oxide thickness and hence a reduction in transistor supply voltages. However, chip supply voltages have not decreased in line with the reduction in transistor supply voltages.

Drain-Extended MOS (DE-MOS) transistors have been designed to allow increased drain voltages, but there is no change in the voltage tolerable at the gate of the device. The restricted gate voltage typically leads to the use of gate drive circuits, but such circuits greatly increase the circuit area as the gate drive circuit can be as big as the DE-MOS transistor.

Another approach is to utilise dedicated high-voltage transistors, for example by the addition of a further gate-oxide to a conventional dual gate-oxide process. However, such systems increase the manufacturing cost and cycle time and are therefore undesirable.

There is therefore a requirement for a CMOS technology providing an increased transistor gate supply voltage. The embodiments described below are not limited to implementations which solve any or all of the disadvantages discussed above.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of claimed subject matter.

There is provided a semiconductor device comprising at least one gate-depletion drain-extended MOS transistor and at least one other MOS transistor of the same polarity, wherein the at least one gate-depletion drain-extended MOS transistor and the at least one other MOS transistor each comprise a gate-oxide having an equivalent thickness and a polysilicon gate, and the polysilicon gate of the at least one gate-depletion drain-extended MOS transistor has a significantly lower doping level than the polysilicon gate of the at least one other MOS transistor.

The doping of the polysilicon gate of the at least one gate-depletion drain-extended MOS transistor may be lower than the doping level of the at least on other MOS transistor by approximately a factor of 5 to 50.

There is also provided a semiconductor device comprising at least one gate-depletion drain-extended MOS transistor and at least one either MOS transistor of the same polarity, wherein the at least one gate-depletion drain-extended MOS transistor and the at least one other MOS transistor each comprise a gate-oxide having an equivalent thickness and a polysilicon gate, and the polysilicon gate of the at least one other MOS transistor has a comparable doping level to the source and drain regions of that transistor, and the polysilicon gate of the at least one gate-depletion drain-extended MOS transistor has a significantly lower doping level than the source and drain regions of that transistor.

The doping level of the polysilicon gate at the at least one gate-depletion drain-extended MOS transistor may be lower than the doping level of the source and drain regions of that transistor by approximately a factor of 5 to 50.

There is also provided a design for the semiconductor devices described above.

There is also provided a mask set for fabricating the semiconductor devices described above.

There is also provided a method of fabricating a semiconductor device comprising at least one gate-depletion drain-extended MOS transistor and at least one other MOS transistor of the same polarity, comprising the steps of forming a gate oxide layer for both transistors in the same process step, defining a polysilicon gate for both transistors in the some process step, depositing and patterning a photo-resist layer such that the polysilicon gate of the at least one other MOS transistor is exposed and the polysilicon gate of the at least one gate-depletion drain-extended MOS transistor is not exposed, and applying an implant step to the wafer such that the exposed gates are doped and the masked gates are not doped.

The polysilicon gate and the source and drain regions of the at least one other MOS transistor, and the source and drain regions of the at least one gate-depletion drain-extended MOS transistor, may be exposed, the polysilicon gate of the at least one gate-depletion drain-extended MOS transistor may be masked, and the implant step may also form source and drain regions in the transistors.

There is also provided a method fabricating a semiconductor device comprising at least one gate-depletion drain-extended MOS transistor and at least one other MOS transistor of the same polarity each having an equivalent gate oxide thickness, comprising the steps of applying a first or a second source extension implant type to the at least one other transistor, and applying both the first and the second source extension implant type to the gate-depletion drain-extended MOS transistor.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 1:
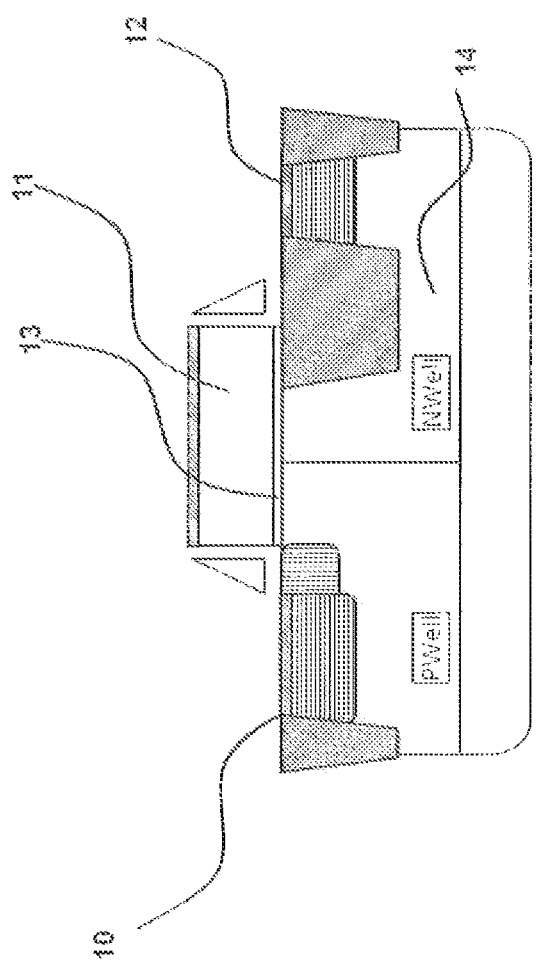
FIG. 1 shows a drain extended NMOS transistor.

FIG. 1 shows a conventional DE-NMOS device. Highly doped, N++, source 10, gate 11 and drain 12 regions are utilised with a standard-thickness oxide layer 13 provided by the particular process. A drift region 14 is provided to enable the transistor to withstand higher drain voltages than standard NMOS devices.

Tolerable gate voltage is dependent on the electric field strength across the gate oxide, due to failure of the gate oxide at high field strengths. Field strength is proportional to gate capacitance, which in turn is inversely proportional to gate oxide thickness. Increasing the gate oxide thickness thus gives a reduction in gate capacitance and an increase in tolerable gate voltage. However, as explained above the addition of a thicker oxide layer to a process is undesirable.

Figure 2:
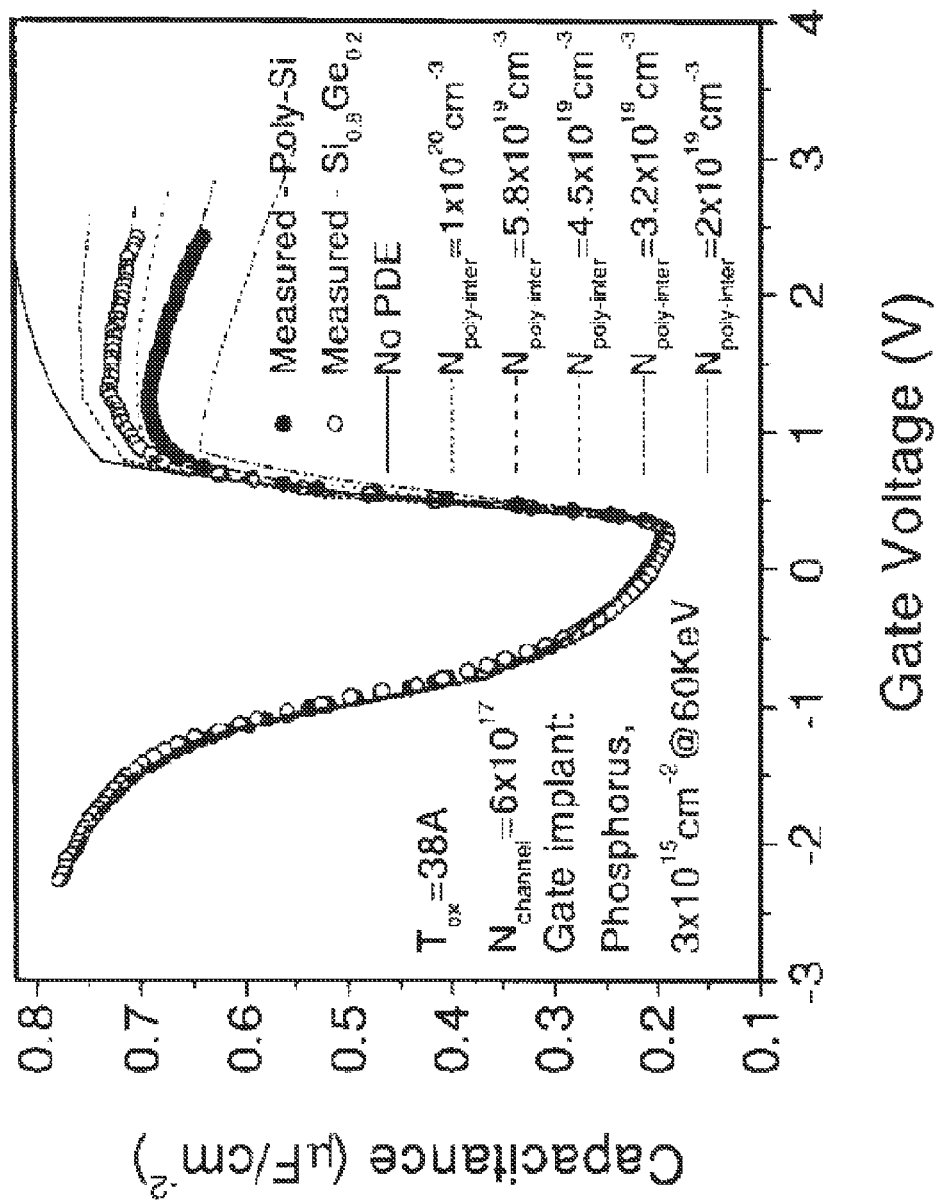
FIG. 2 shows a graph of Capacitance vs gate voltage with $V_{sb}=0$.

FIG. 2 shows a graph of $C_{GB}$ against $V_{GB}$ for varying gate doping ($N_P$). In the on-state for high doping levels remains relatively constant with increasing $V_{GB}$, but for lower doping levels $C_{GB}$ reduces significantly as $V_{GB}$ increases. The reduction in gate capacitance is due to depletion of the gate close to the gate oxide interface, increasing the effective thickness of the gate oxide. This effect is generally undesirable as this lowers the transconductance compared to its designed behaviour.

However, in the embodiments described below, DE-MOS devices utilising gate-depletion to increase the permissible gate voltages are described together with fabrication techniques for such devices utilising conventional dual-oxide fabrication processes.

Figure 3:
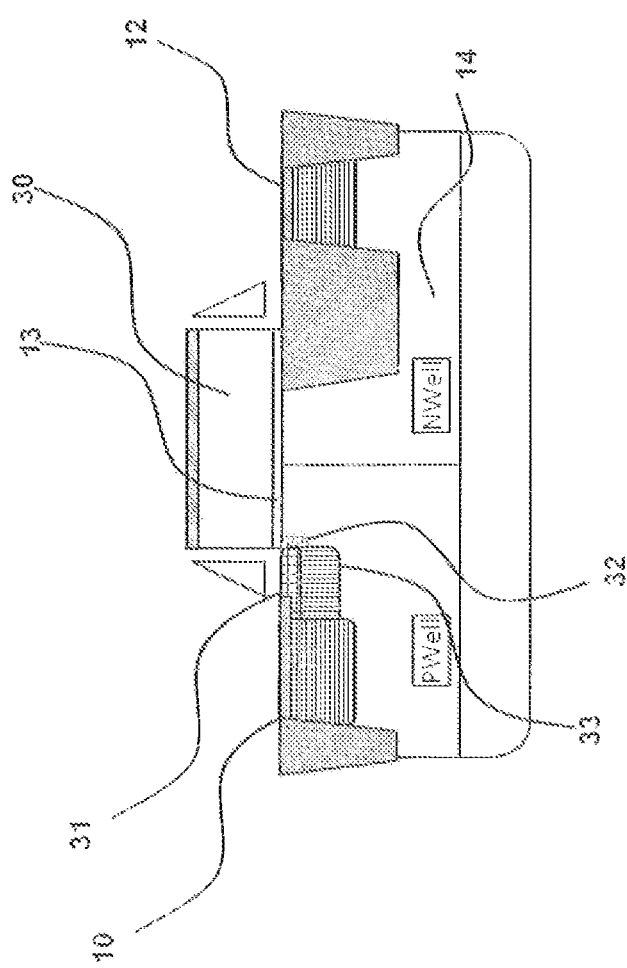
FIG. 3 shows a gate-depletion drain extended NMOS transistor.

FIG. 3 shows a gate-depletion DE-NMOS transistor. In comparison to the DE-NMOS device of FIG. 1, the gate 30 is only lightly doped, but the gate oxide 13, and source and drain implants 10, 12 are as used in the device of FIG. 1. The source extension implants comprise both a core transistor LDD implant 31, with pocket implants 32, and an I/O transistor LDD implant 33. All implant and deposition types utilise conventional steps in the fabrication process selected.

In a conventional device formed using a standard dual-oxide process the polysilicon gate and the source and drain regions have a comparable doping level, whereas in the device of FIG. 3 the doping level of the polysilicon gate is substantially lower than the doping level of the source and drain regions. In an example device the polysilicon gate doping level may be lowered by a factor of five to fifty compared to a conventional device which is approximately five to fifty times lower than the doping of the source and drain regions of the device. In a particular example the polysilicon gate doping level may be a factor of five lower than conventional device, which is approximately five times lower than the doping of the source and drain regions of the device.

The resulting device can tolerate higher gate voltages due to the lightly doped gate and the formation of a depletion layer at higher gate voltages. The use of both core and I/O source extension implants will be discussed below.

Figure 4:
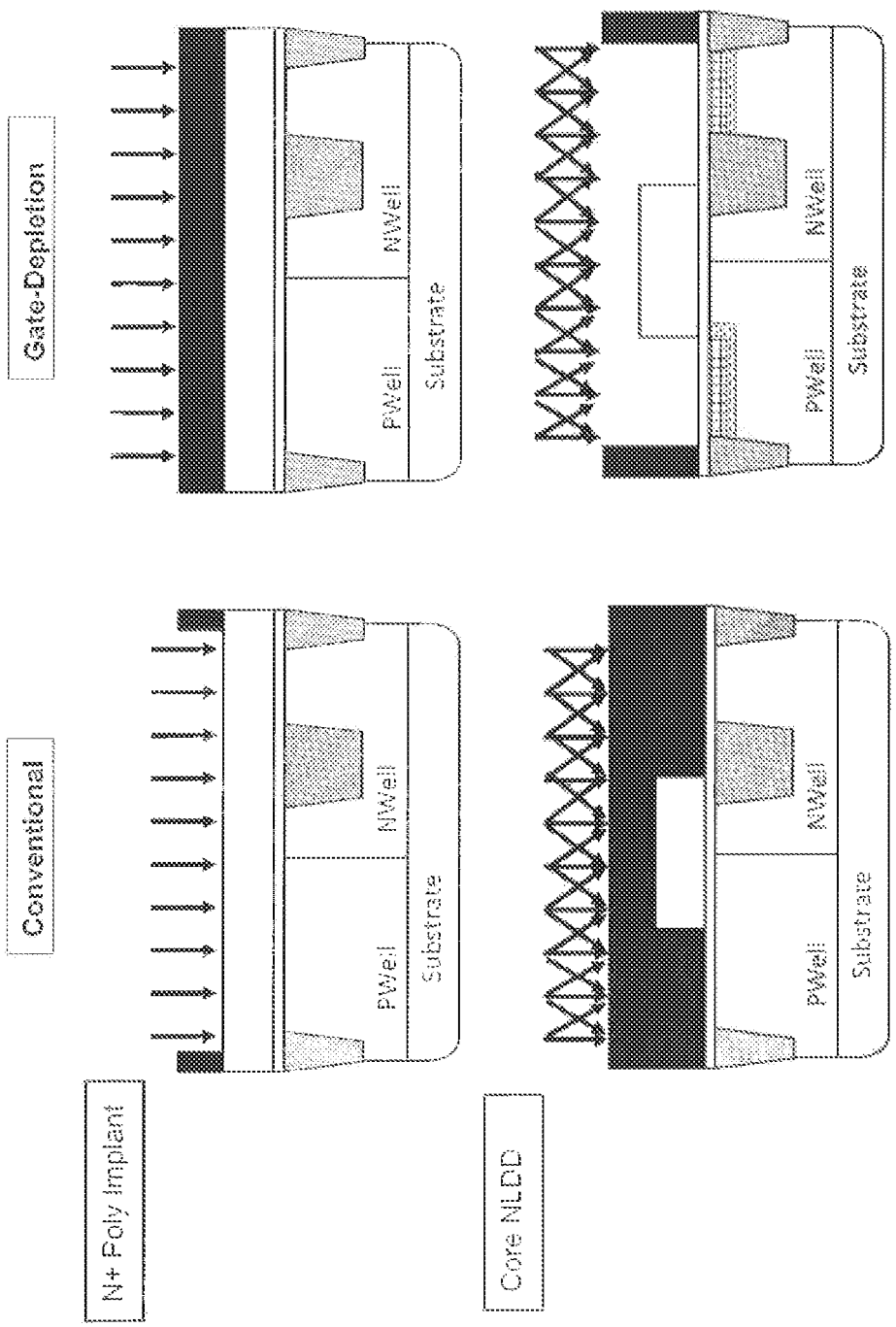
FIG. 4 shows selected process steps for the fabrication of a gate-depletion drain extended NMOS transistor.
Figure 4:
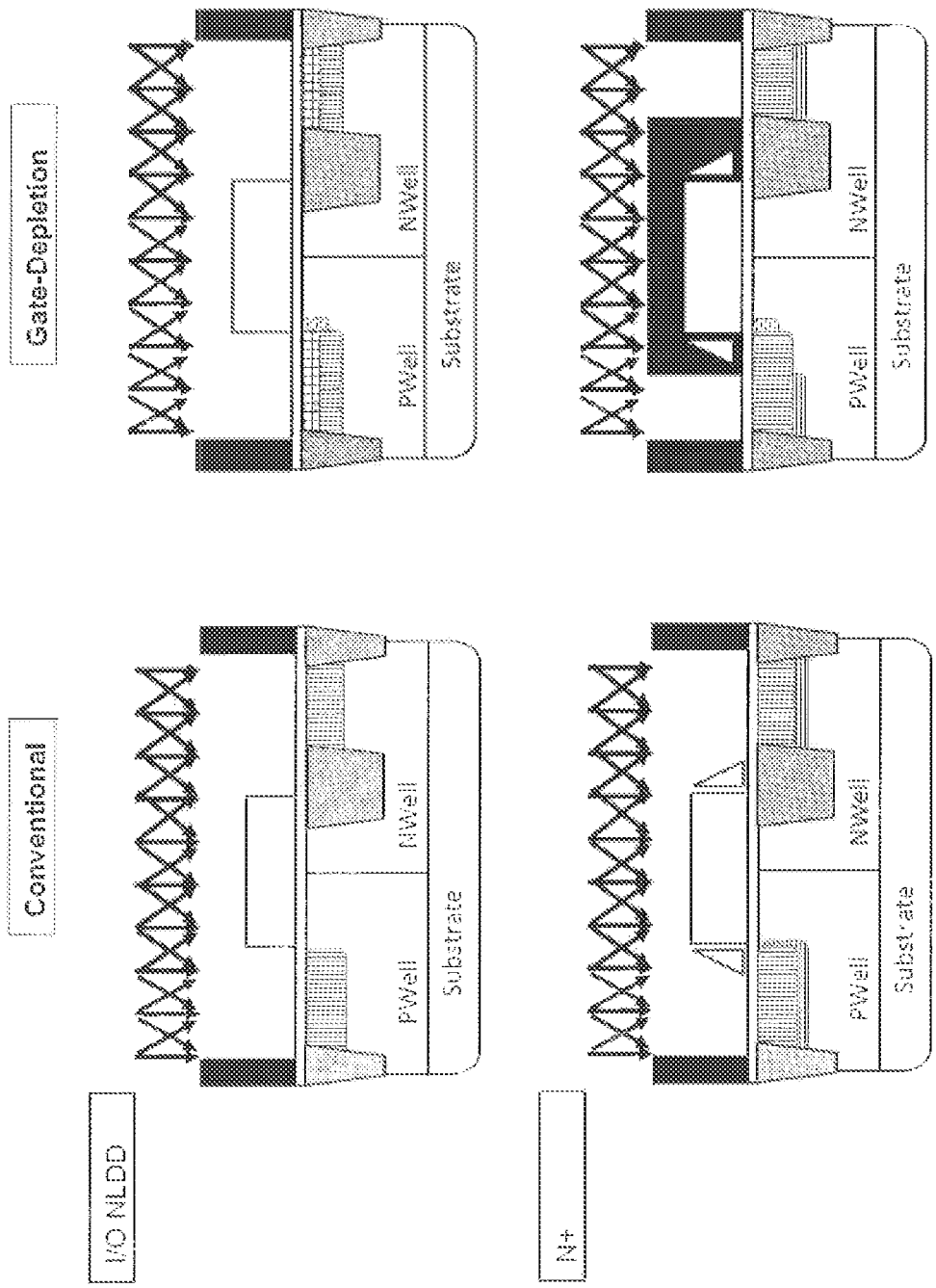

FIG. 4 shows a fabrication process for the gate-depletion DE-NMOS translator of FIG. 3 alongside a fabrication process for conventional I/O DE-NMOS transistor. FIG. 4 only represents exemplary steps in the fabrication process and is not intended to reflect every process step required for fabrication. Similarly the ordering of the steps is for example only and may be altered according to the particular process being utilised. All of the steps of the fabrication process are conventional, with the only modifications being to the mask patterns utilised to pattern the various photo-resist layers. Conventional fabrication processes can therefore be utilised for the new device types, with only appropriate modification of the masks being necessary.

In the conventional process, after deposition of the polysilicon layer, the N+ poly implant is utilised to dope the polysilicon gate. In the gate depletion device process the device is masked with photo-resist during this step such that no implant is made to the polysilicon which will become the gate of the gate depletion device.

For a conventional I/O transistor the whole area is masked for the Core NLDD implant step, but in the gate-depletion device this implant is made over the whole area, including the polysilicon gate. This step also forms the pocket implants. In addition, the I/O NLDD implant is also made over the whole area as in the conventional process. This combination of implants results in the presence of both the I/O and Core transistor source and drain extension regions, for the reasons explained below.

In the conventional process a further N+ doping step is performed over the whole area, to form the Source and Drain regions, and to further dope the gate. In the gate-depletion process the gate area is masked with photo-resist to restrict the N+ doping to the source/drain regions such that there is no further doping of the gate.

The resulting device is that shown in FIG. 3 having both Core and I/O LDD source/drain extensions together with a lightly doped gate.

Figure 5:
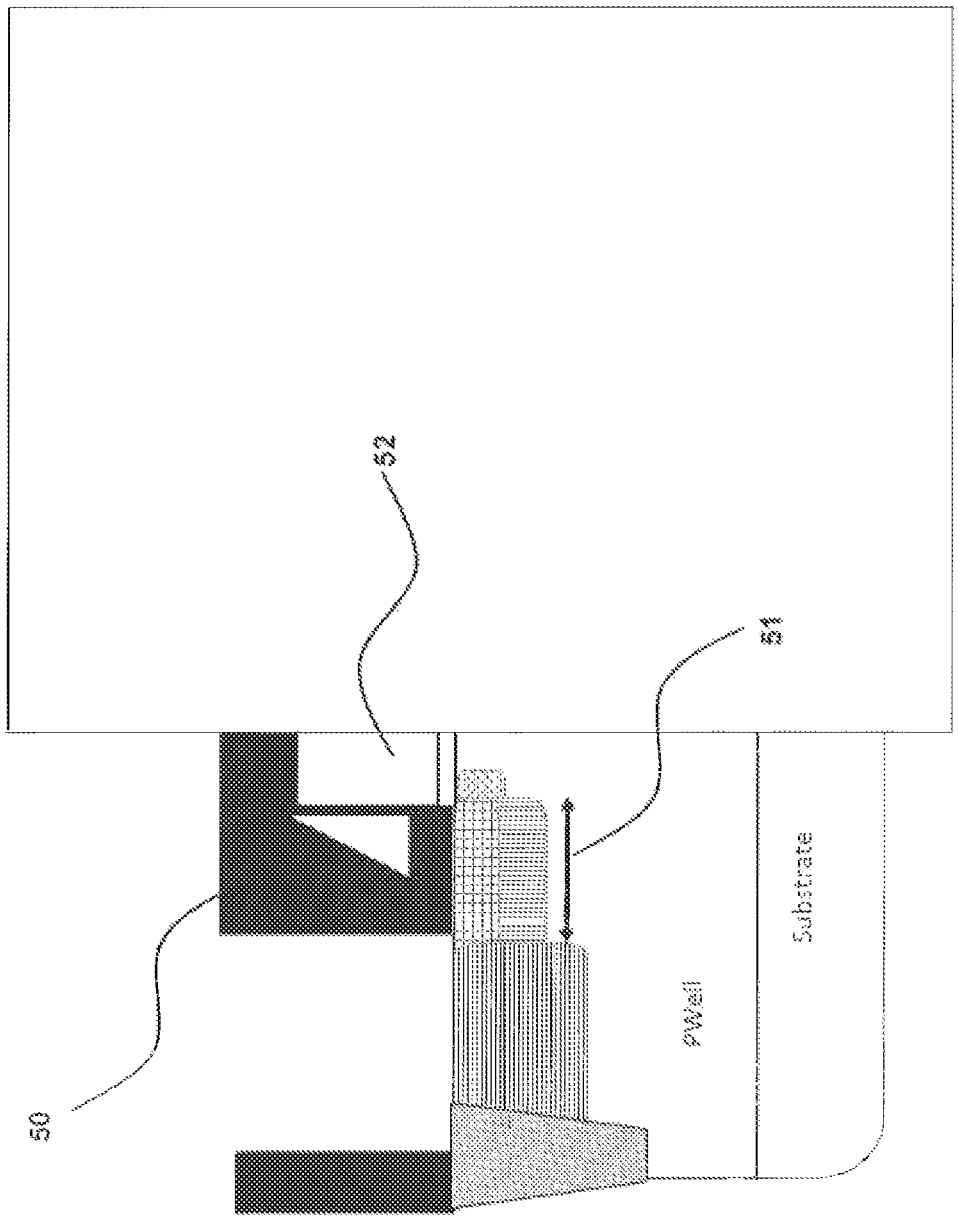
FIG. 5 shows the source region of a gate-depletion drain extended NMOS transistor prior to silicide formation.

FIG. 5 shows an enlarged view of the source-side of the gate after patterning of the photo-resist layer 50 for the final N+ implant step of the method shown in FIG. 4. The photo-resist is patterned to extend by a distance 51 beyond the edge of the gate 52 to allow for tolerances in the masking and layer-to-layer alignment processes. For process nodes in the range 32-65 nm the distance 51 is likely to be in the range 60-140 nm. This results in the source implant being spaced from the gate by that distance.

Figure 6:
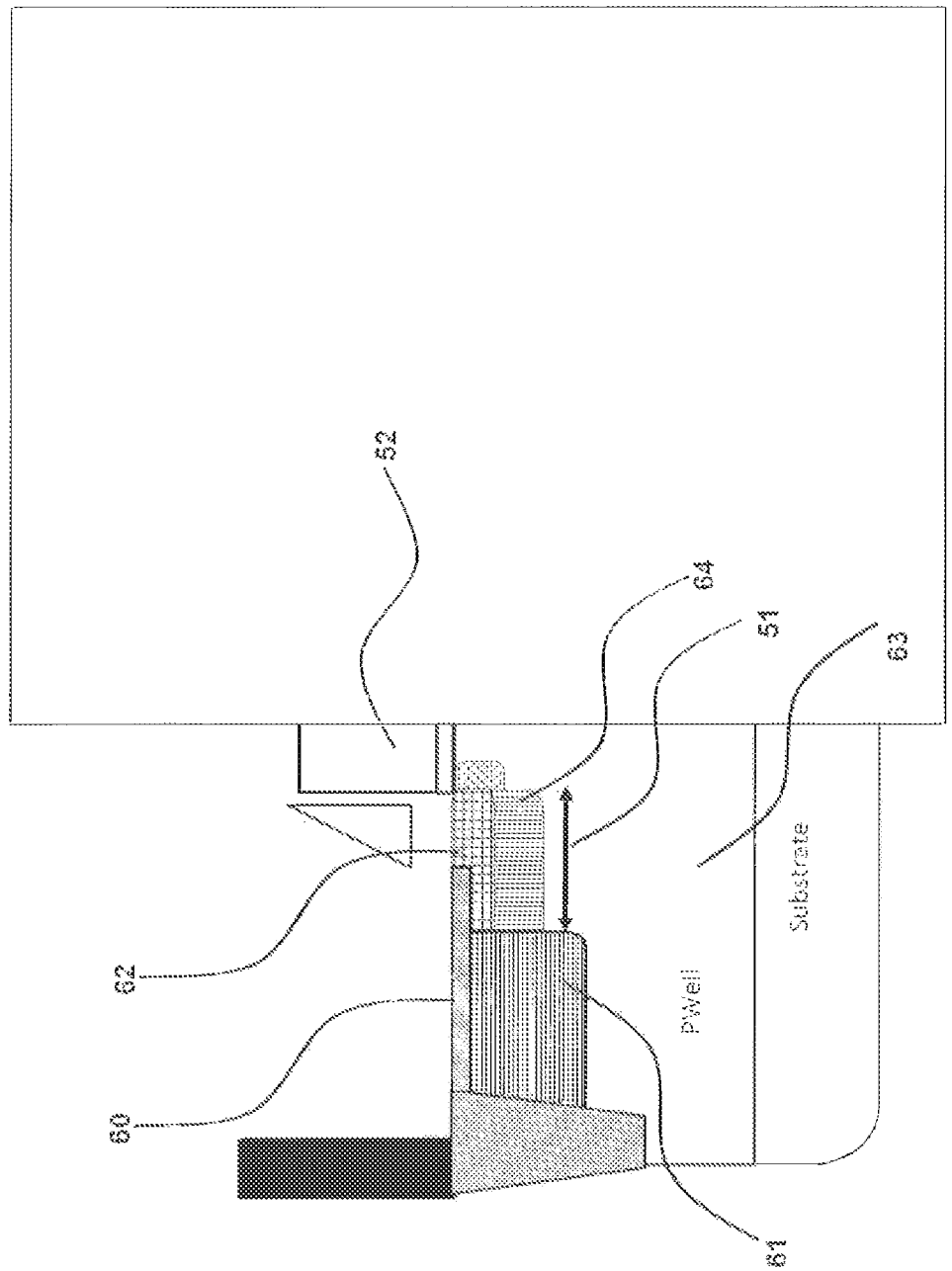
FIG. 6 shows the source region of a gate-depletion drain extended NMOS transistor after silicide formation.

FIG. 6 shows an enlarged view of the source-side of the gate after the formation of the silicide layer 60. Since the silicide layer 60 is formed over the whole area of the device, it extends beyond the edge of the source implant 61 towards the gate 52. If only the shallow Core LDD implant 62 is utilised leakage is likely to occur between the silicide layer 60 and the bulk silicon 63 of the device due to insufficient depth of the pn-junction between the Core LDD region 62 and the PWell 63 compared to the bottom of the silicide layer 60. Accordingly the deeper I/O NLDD implant 64 is utilised to give adequate depth below the silicide layer 60 to prevent leakage.

In the above embodiment an I/O NLDD implant is combined with a Core LDD implant to set the required polysilicon doping, but the I/O NLDD implant could be used alone if that level of doping is appropriate for the polysilicon.

Bulk leakage may also occur if the I/O LDD implant cannot counter-dope the pocket. Devices suffering from bulk leakage, due to an insufficiently deep LDD implant, or insufficient doping to overcome the pocket implant, may be utilised in configurations with a zero back bias.

In alternative processes a masking process may be utilised to prevent silicide formation beyond the edge of the source implant, thereby avoid the leakage problems discussed above. However, such processes require an increased layout area to accommodate the silicide blocking and increase the series resistance at the source, which are both undesirable.

Table 1 below shows a comparison of exemplary process steps in the fabrication of a conventional DE-MOS device and a gate-depletion DE-MOS device. As discussed previously the steps are conventional for a dual-oxide CMOS fabrication process with the new device being formed by varying the mask layouts. As will be understood the disclosure above in relation to NMOS devices is extended to PMOS devices in the table below according to known principles once the NMOS device and process described above is understood. In Table 1 'Yes' indicates that the entire area or the transistor is exposed to the implant step. 'No' indicates that none of the transistor is exposed to the implant step (for example it is masked by a photo-resist layer). 'Identical' indicates the same mask pattern and process step is utilised, and 'partial' indicates that part of the transistor is exposed to the implant step (for example it is partially masked by a patterned photo-resist layer).

TABLE 1

| Process Flow | Masking Step | Conventional DE-NMOS | Gate Depletion DE-NMOS | Conventional DE-PMOS | Gate Depletion DE-PMOS |
| --- | --- | --- | --- | --- | --- |
| Isolation (Active Area) | Isolation (Active Area) | IDENTICAL | | IDENTICAL | |
| Well Implants | NWell | IDENTICAL | | IDENTICAL | |
| | PWell | IDENTICAL | | IDENTICAL | |
| Gate Stack | I/O Gate-Ox | IDENTICAL | | IDENTICAL | |
| | Poly N-doping | YES | NO | NO | NO |
| | Poly | IDENTICAL | | IDENTICAL | |
| S/D Extensions | Core NLDD | NO | YES | NO | NO |
| | Core PLDD | NO | NO | NO | YES |
| | I/O NLDD | YES | YES | NO | NO |
| | I/O PLDD | NO | NO | YES | YES |
| S/D | N+ | YES | PARTIALLY | NO | NO |
| | P+ | NO | NO | YES | PARTIALLY |
| Subsequent steps | Subsequent steps | IDENTICAL | | IDENTICAL | |

The methods described herein therefore provide processes for the formation of gate-depletion DE-MOS devices using conventional processes without requiring additional processing as required by previous techniques to increase the tolerable gate voltage. The gate-depletion devices have a reduced gate doping compared to other devices formed using the particular CMOS process, leading to gate-depletion and a subsequent tolerance for higher gate voltages.

As noted above, revised mask layouts required for the new devices which may require the design rules for a process to be modified to allow design and use of the new layouts.

As will be appreciated, implant steps may be added to conventional process flows to achieve the desired levels of polysilicon depletion if they cannot be achieved using combinations of the existing steps, while still avoiding the process complexity of adding a physically thicker gate-oxide.

Figure 7:
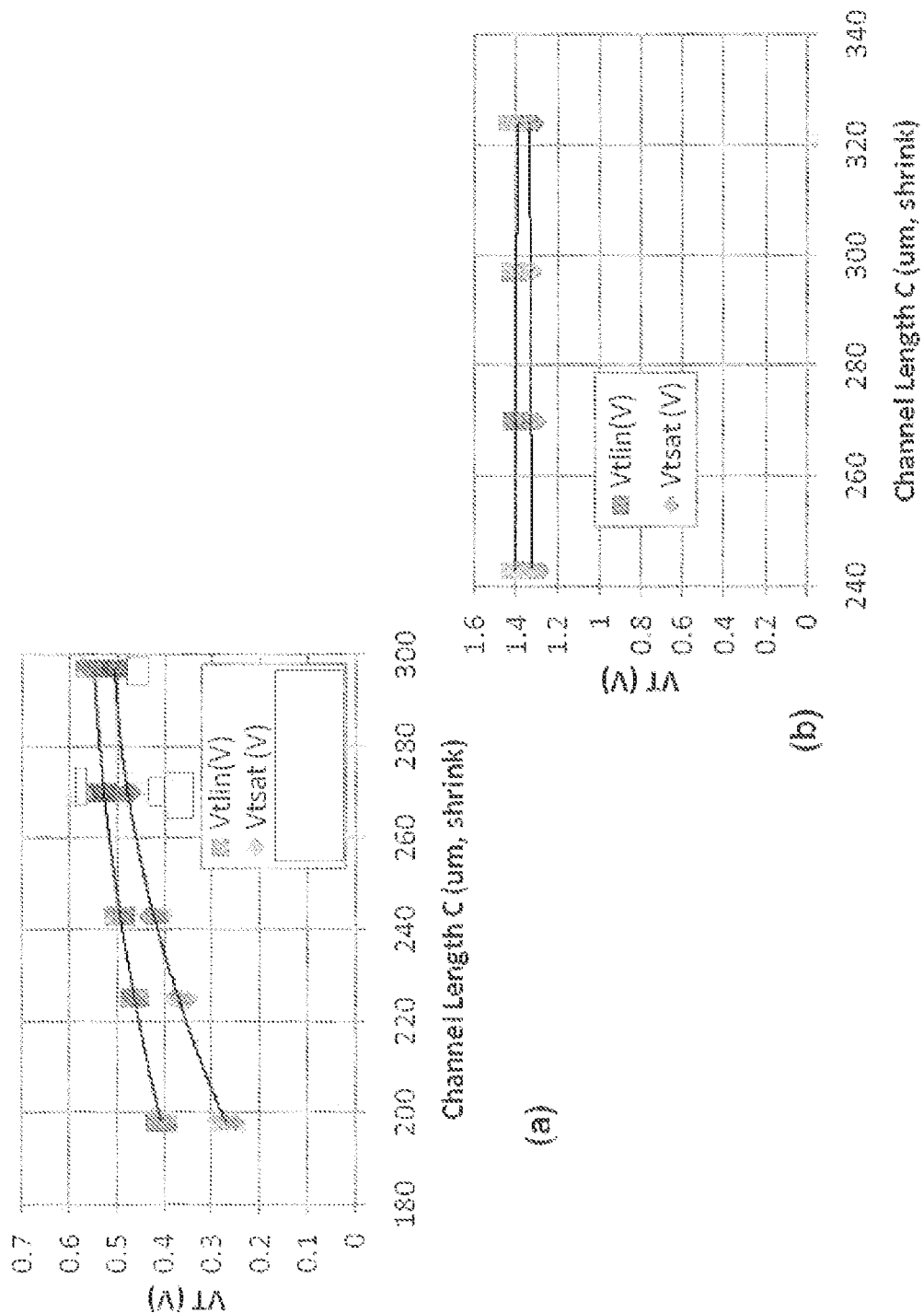
FIG. 7 shows threshold voltage vs channel length graphs for conventional and gate-depletion drain extended NMOS transistors.

FIG. 7 shows plots of threshold voltage against channel length for (a) a conventional DE-NMOS device, and (b) a gate-depletion DE-NMOS device constructed using the methods described hereinbefore. As can be seen, the threshold voltage has been increased to 1.4V which is a workable value for the applications in which such a transistor will be utilised and helps to maintain sufficient hot carrier performance with higher gate voltage.

Figure 8:
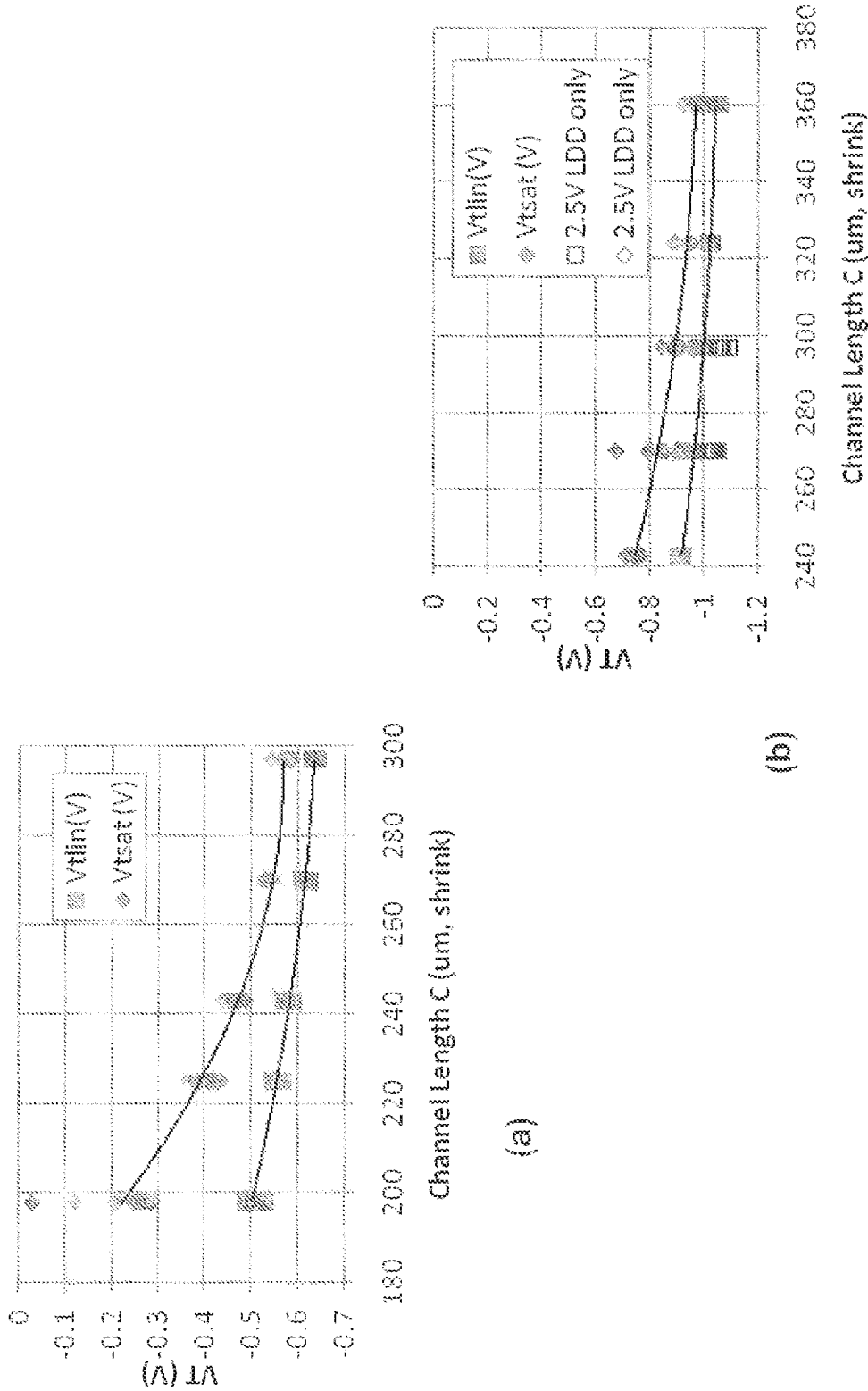
FIG. 8 shows threshold voltage vs channel length graphs for conventional and gate-depletion drain extended PMOS transistors.

FIG. 8 shows equivalent plots to FIG. 7 but for PMOS devices which also demonstrate an increase in the magnitude of the threshold voltage.

Figure 9:
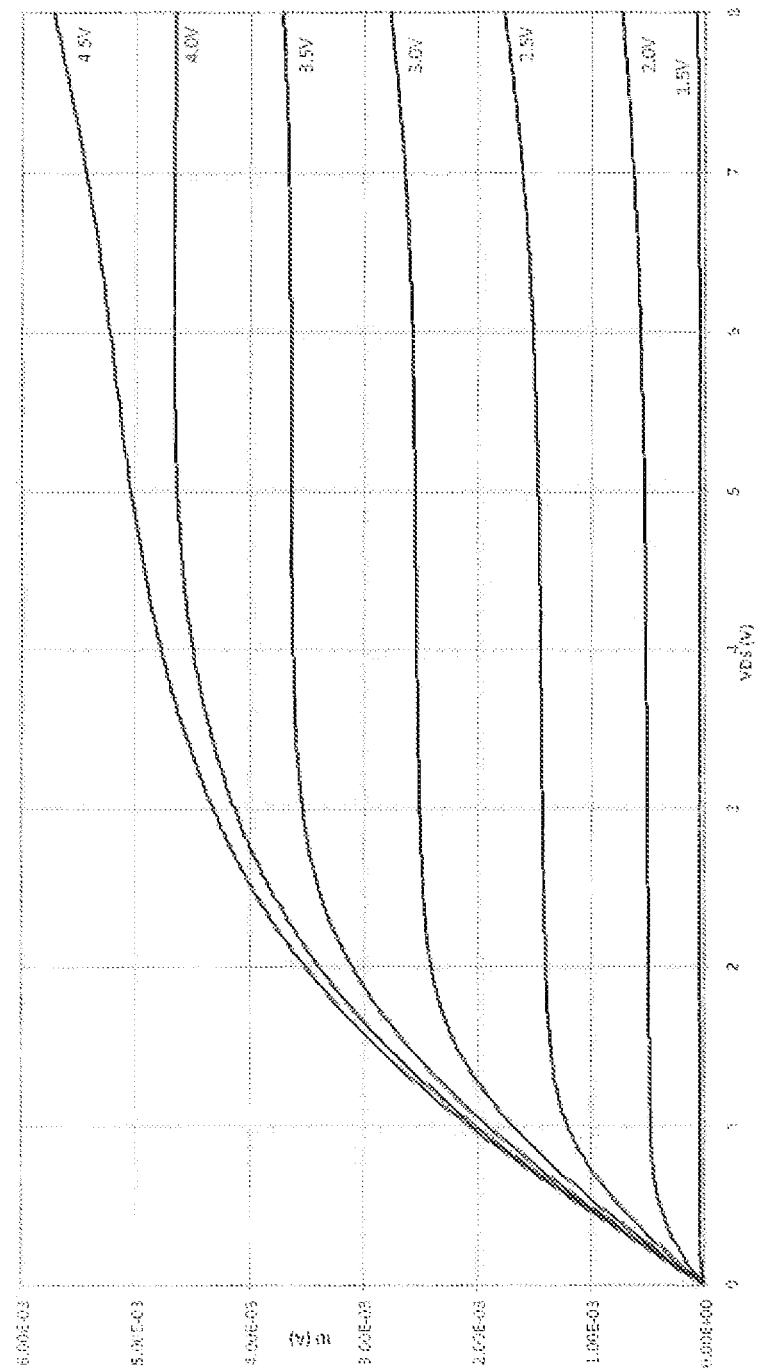
FIG. 9 shows an output characteristic plot for an NMOS gate depletion drain extended transistor.
Figure 10:
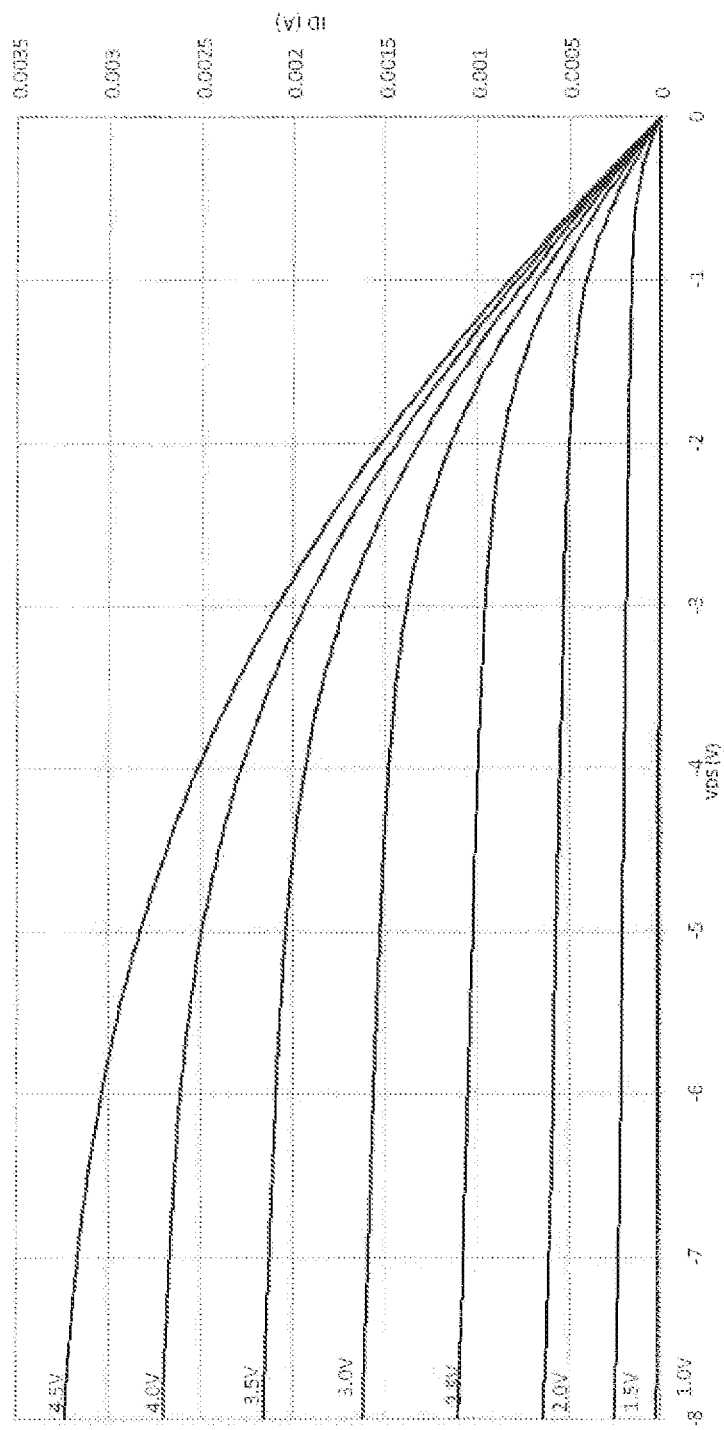
FIG. 10 shows an output characteristic plot for a PMOS gate depletion drain extended transistor with a gate oxide thickness of 52 Å.

FIGS. 9 and 10 shows $I_D$ vs $V_{DS}$ data N- and PMOS devices respectively fabricated according to the above disclosure.

As will be appreciated the disclosure above is in relation to the source and gate regions of the devices and is independent of the particular drift-region design of the transistor and may therefore be applied to any suitable drain-extended MOS transistor design. The techniques may also be applied to conventional MOS transistor designs in the absence of a drift region, but such transistors may find limited application as the tolerable drain voltage may be limited to less than the tolerable gate voltage.

As will be apparent where comparative terms such as 'greater' and 'less' are used they may be used in reference to the magnitude of the value and not the absolute value as is appropriate to each use of the word.

Where comparisons have been made between conventional devices and gate depletion devices it will be understood that those comparisons are between device of same polarity—that is, NMOS is compared to NMOS and PMOS is compared to PMOS.

The term semiconductor device is used herein to refer to any section of semiconductor material comprising at least one semiconductor component, and is not intended to be limited to a completed and packaged device. For example the term may apply to a region of a wafer, a die cut from a wafer, or a packaged die.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of the invention.

The invention claimed is:

1. A method of fabricating a semiconductor device comprising at least one gate-depletion drain-extended MOS transistor and at least one other MOS transistor of the same polarity, comprising the steps of
   forming a gate oxide layer for both transistors in the same process step,
   defining a polysilicon gate for both transistors in the same process step,
   depositing and patterning a photo-resist layer such that the polysilicon gate of the at least one other MOS transistor is exposed and the polysilicon gate of the at least one gate-depletion drain-extended MOS transistor is not exposed, and
      applying an implant step to the wafer such that the exposed gates are doped and the masked gates are not doped, the implant step resulting in the presence of Core, Input/Output (I/O) and pocket source extension implants, the ISO source extension implant having sufficient depth and is of a sufficient doping to overcome the pocket implant so as to prevent bulk leakage, and wherein a doping level of the I/O extension implant is combined with another doping level of the Core extension implant to set the significantly lower doping level of the polysilicon gate of the at least one gate-depletion drain-extended MOS transistor.

2. The method according to claim 1, wherein
   the polysilicon gate and the source and drain regions of the at least one other MOS transistor, and the source and drain regions of the at least one gate-depletion drain-extended MOS transistor, are exposed,
   the polysilicon gate of the at least one gate-depletion drain-extended MOS transistor is masked, and
   the implant step also forms source and drain regions in the transistors.

3. A method of fabricating a semiconductor device comprising at least one gate-depletion drain-extended MOS transistor and at least one other MOS transistor of the same polarity each having an equivalent gate oxide thickness, comprising the steps of
   applying a first, second and third source extension implant type to the at least one other transistor, and
   applying the first, second and third source extension implant type to the gate-depletion drain-extended MOS transistor, wherein the third source extension implant is of a of a doping that is sufficiently overcome by the first and the second implants so as to prevent bulk leakage.

* * * * *